United States Patent
Sato et al.

(10) Patent No.: US 7,102,171 B2
(45) Date of Patent: Sep. 5, 2006

(54) MAGNETIC SEMICONDUCTOR MATERIAL AND METHOD FOR PREPARATION THEREOF

(75) Inventors: Katsuaki Sato, Kanagawa (JP); Gennadiy Medvedkin, St. Petersburg (RU); Takayuki Ishibashi, Tokyo (JP)

(73) Assignee: Japan Science and Technology Corporation, Kawaguchi (JP)

( * ) Notice: Subject to any disclaimer, the term of this patent is extended or adjusted under 35 U.S.C. 154(b) by 79 days.

(21) Appl. No.: 10/344,895

(22) PCT Filed: Aug. 29, 2001

(86) PCT No.: PCT/JP01/07408

§ 371 (c)(1),
(2), (4) Date: Aug. 1, 2003

(87) PCT Pub. No.: WO02/19352

PCT Pub. Date: Mar. 7, 2002

(65) Prior Publication Data

US 2004/0014244 A1    Jan. 22, 2004

(30) Foreign Application Priority Data

Aug. 30, 2000 (JP) .............................. 2000-261367

(51) Int. Cl.
*H01L 29/15* (2006.01)
*H01L 21/00* (2006.01)
(52) U.S. Cl. ............................... 257/78; 438/3; 438/95
(58) Field of Classification Search .................... 438/3, 438/95, 930; 257/78, 200
See application file for complete search history.

(56) References Cited

U.S. PATENT DOCUMENTS 3,719,481 A * 3/1973 Makino et al. ............... 430/55
5,591,500 A * 1/1997 Kawanishi .................. 428/64.1
5,627,012 A * 5/1997 Tominaga et al. ....... 430/270.13
5,736,657 A * 4/1998 Ide et al. ...................... 75/230
2002/0130311 A1* 9/2002 Lieber et al. .................. 257/1

FOREIGN PATENT DOCUMENTS

JP          6-45248         2/1994

OTHER PUBLICATIONS

Medvedkin et al., "Room Temperature Ferromagnetism in Novel Diluted Magnetic Semiconductor CdMnGeP2", Oct. 2000, Jpn. J. Appl. Phys., vol. 39, pp. L949-L951.*

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A magnetic semiconductor material having magnetization characteristics and a method for preparing the same is provided.

In the method for preparing the magnetic semiconductor, Mn is vapor-deposited at a thickness of 200 to 300 Å onto a $CdGeP_2$ single crystal (2) while the $CdGeP_2$ single crystal (2) is maintained at a temperature of about 390° C. in a molecular beam epitaxy apparatus (1). The Mn-deposited $CdGeP_2$ single crystal is heated at a temperature of about 510° C. for 1 hour. Thus, a magnetic semiconductor comprising $CdMnGeP_2$ and having magnetization characteristics at room temperature is prepared.

6 Claims, 7 Drawing Sheets

MAGNETIC SEMICONDUCTOR MATERIAL AND METHOD FOR PREPARATION THEREOF

TECHNICAL FIELD

The present invention relates to a magnetic semiconductor material and a method for preparing the same.

BACKGROUND ART

Known magnetic semiconductor materials have magnetic properties only at low temperature. For example, $CdCr_2Se_4$ is Tc=130 K; EuO is Tc=68 K; and GaMnAs is Tc=110 K.

DISCLOSURE OF INVENTION

Since the said known magnetic semiconductor materials have magnetic properties only at extremely low temperature, it is difficult to make use of them.

Accordingly, an object of the present invention is to provide a magnetic semiconductor material having magnetization properties at room temperature and a method for preparing the magnetic semiconductor material.

In order to achieve the object, the present invention provides the following:

(1) A magnetic semiconductor material has magnetization properties at room temperature and comprises a Group $II-IV-V_2$ compound semiconductor, used as a starting material, having a chalcopyrite structure whose elements are partially substituted by a transition element.

(2) In the magnetic semiconductor material described in (1), the Group $II-IV-V_2$ compound semiconductor having the chalcopyrite structure is $CdGeP_2$, and the transition element is Mn (the resulting material is hereinafter referred to as $CdMnGeP_2$)

(3) In the magnetic semiconductor material described in (1), the Group $II-IV-V_2$ compound semiconductor having the chalcopyrite structure is $ZnGeP_2$, and the transition element is Mn.

(4) A method for preparing a magnetic semiconductor material comprises the steps of: vapor-depositing Mn at a thickness of 200 to 300 Å onto a $CdGeP_2$ single crystal while the temperature of the $CdGeP_2$ single crystal is maintained about 390° C. in a molecular beam epitaxy apparatus; and heating the Mn-deposited $CdGeP_2$ single crystal at a temperature of about 510° C. for 1 hour. Thus, a magnetic semiconductor comprising $CdMnGeP_2$ and having magnetization properties at room temperature is obtained.

(5) In the method for preparing a magnetic semiconductor material described in (4), the degree of vacuum in the vapor-deposition step and the heating step is on the order of $10^{-8}$ Torr or less.

(6) A method for preparing a magnetic semiconductor material comprises the step of vapor-depositing and diffusing Mn at a thickness of about 300 Å onto a $ZnGeP_2$ single crystal while the temperature of the $ZnGeP_2$ single crystal is maintained about 400° C. in a molecular beam epitaxy apparatus. Thus, a magnetic semiconductor comprising $ZnGeP_2$ and having magnetization properties at room temperature or more is obtained without heating the Mn-deposited $ZnGeP_2$.

BEST MODE FOR CARRYING OUT THE INVENTION

The embodiment of the present invention will now be illustrated.

According to the present invention, a magnetic semiconductor material can be prepared which comprises a Group $II-IV-V_2$ compound semiconductor, used as a starting material, having a chalcopyrite structure and has ferromagnetism at room temperature. The elements of the Group $II-IV-V_2$ compound semiconductor are partially substituted by a transition element.

The Group $II-IV-V_2$ chalcopyrite semiconductor will now be roughly described. For more detail, refer to the new material handbook, "Semiconductor Material" edited by Takahasi, K. (Shokodo, 1993, 6) Chapter 8, pp. 572–585.

When the Group II element in a Group II-VI compound semiconductor (such as ZnS) is regularly substituted by Group Ib and III elements, a Group $I-III-VI_2$ compound semiconductor containing three elements is obtained. Also, when the Group III element in a Group III-V compound semiconductor (such as GaAa) is regularly substituted by Group IIb and IV elements, a Group $II-IV-V_2$ compound semiconductor is obtained.

The crystal structure of those semiconductors has tetragonal unit cells in which two unit cells having a sphalerite structure are laid one upon the other in the c axis direction. The tetragonal unit cells each contain 4 molecules (16 atoms) and the space group is expressed by $D_{2d}^{12}$. This structure is the same as the structure of chalcopyrite $CuFeS_2$ and is, thus, referred to as chalcopyrite structure.

Eighteen types of Group $II-IV-V_2$ compound semiconductor crystal have been obtained in practice and they are $ZnSiP_2$, $ZnSiAs_2$, $ZnSiSb_2$, $ZnGeP_2$, $ZnGeAs_2$, $ZnGeSb_2$, $ZnSnP_2$, $ZnSnAs_2$, $ZnSnSb_2$, $CdSiP_2$, $CdSiAs_2$, $CdSiSb_2$, $CdGeP_2$, $CdGeAs_2$, $CdGeSb_2$, $CdSnP_2$, $CdSnAs_2$, and $CdSnSb_2$.

The characteristics of the Group $II-IV-V_2$ semiconductors are similar to those of Group III-V semiconductors. The mobility is large and, for example, $CdGeAs_2$ has an electron mobility of 4000 $cm^2/Vs$, which is as large as that of GaAs.

The band gaps cover a wide range. ZnSiP has the largest band gap of 2.96 eV, and is therefore substantially transparent and colorless. $CdGeP_2$ has a band gap of 1.72 eV (at room temperature) and its thin crystal is light red. The melting points are very low. Since, for example, $CdGeP_2$ and $CdGeAs_2$ have melting points of 790° C. and 670° C., respectively, their crystal growth seems to be easy. However, it is difficult to control the vapor pressures of P and As in practice.

As for concrete application, since they have an advantage of having magnetic and semiconductive properties, a large magnetoresistance (MR) is expected. The inventors have not yet made certain, but it has been reported that the GMR of $CdCr_2Se_4$ reaches up to 100%. Accordingly, using $CdCr_2Se_4$, a high-sensitive reading magnetic head for high-density recording and a MRAM (non-volatile magnetic random access memory) are expected.

Also, magnetic red shift of the absorption edge resulting from the application of a magnetic filed is expected. The inventors have not yet made certain, but it has been observed that $CdCr_2Se_4$ exhibited a large shift of the absorption edge of 0.3 eV in the infrared region. Accordingly, a II-IV-$V_2$ material whose absorption edge is in the visible region may provide a device capable of changing colors by applying a magnetic field.

In addition, the II-IV-$V_2$ compound semiconductors advantageously exhibit a large magnetooptic effect in their absorption edges. An optical isolator for visible light can be manufactured making use of this characteristic feature, and holds a greater promise than known CdMnTe optical isolators.

Furthermore, a spin transistor in which the degree of freedom of spin is increased to a semiconductor device can be provided in the future.

An Example of the present invention will now be described.

A magnetic semiconductor material comprising $CdMnGeP_2$ and having magnetization properties at room temperature is prepared from, for example, a starting materials $CdGeP_2$.

The following describes a method for preparing a magnetic semiconductor material comprising $CdMnGeP_2$ of the present invention.

Figure 1:
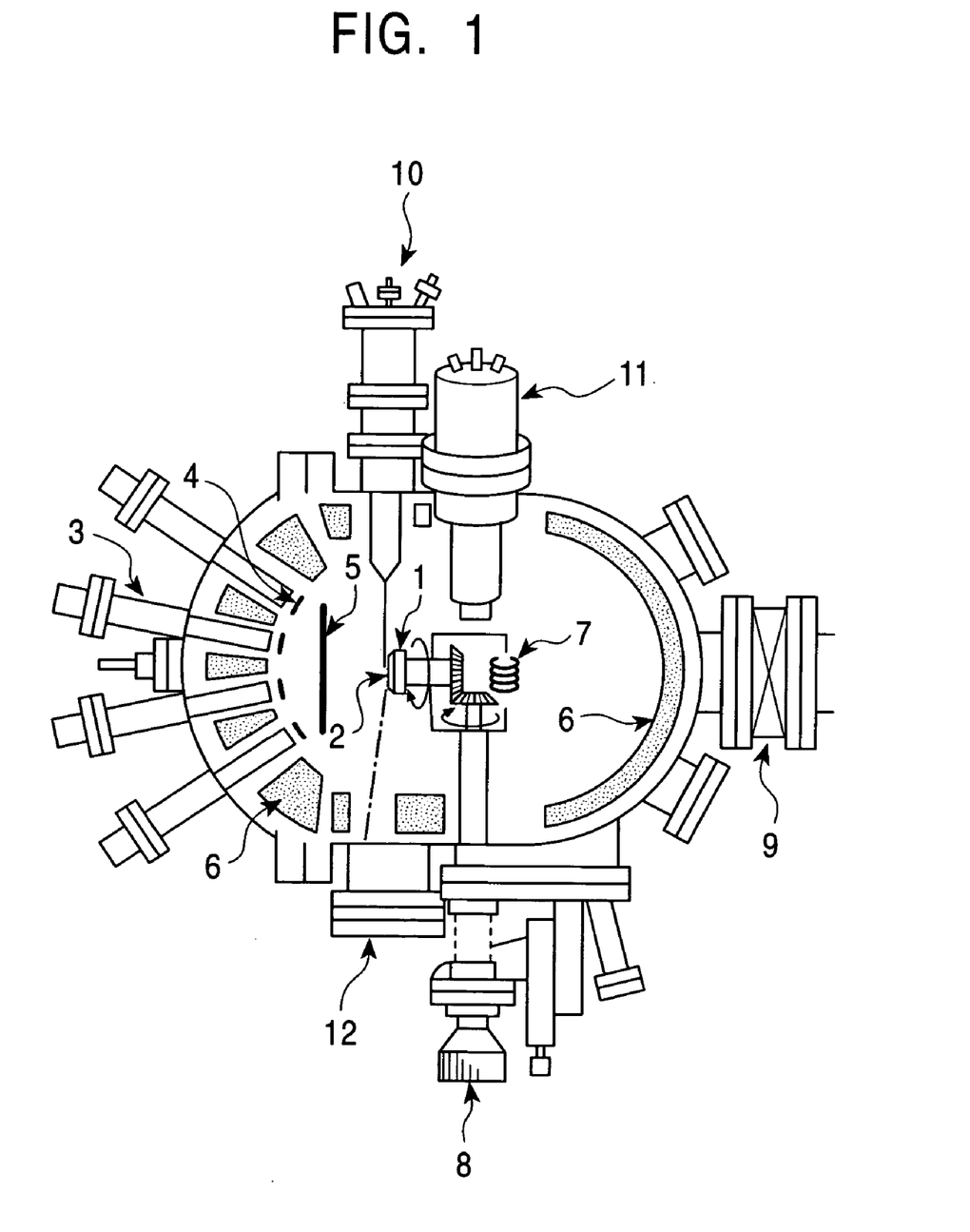
FIG. 1 is a schematic illustration of a molecular beam epitaxy apparatus for a magnetic semiconductor material comprising $CdMnGeP_2$.

FIG. 1 is a schematic illustration of a molecular beam epitaxy apparatus for a magnetic semiconductor material comprising $CdMnGeP_2$ according to an example of the present invention.

In the drawing, reference numeral 1 designates a substrate holder and a substrate heater. Reference numeral 2 designates a $CdGeP_2$ single crystal set on the substrate holder 1. The apparatus also includes a molecular beam source 3, a shutter 4, a main shutter 5, a liquid nitrogen shroud 6, an ion gage 7, a substrate heater manipulator 8, a gate valve 9, a reflection high-energy electron diffraction apparatus (RHEED) 10, a mass spectroscope 11, and RHEED fluorescent screen 12.

Mn (not shown in the drawing) was vapor-deposited onto the $CdGeP_2$ single crystal 2 at a thickness of 200 or 300 Å while the $CdGeP_2$ single crystal 2 was maintained at a temperature of 390° C. in the molecular beam epitaxy apparatus 1. Then, the sample was heated at 510° C. for 1 hour. The degree of vacuum during vapor-deposition and heating was on the order of $10^{-8}$ Torr or less. The Mn deposition rate was set at 8 Å/min.

Figure 2:
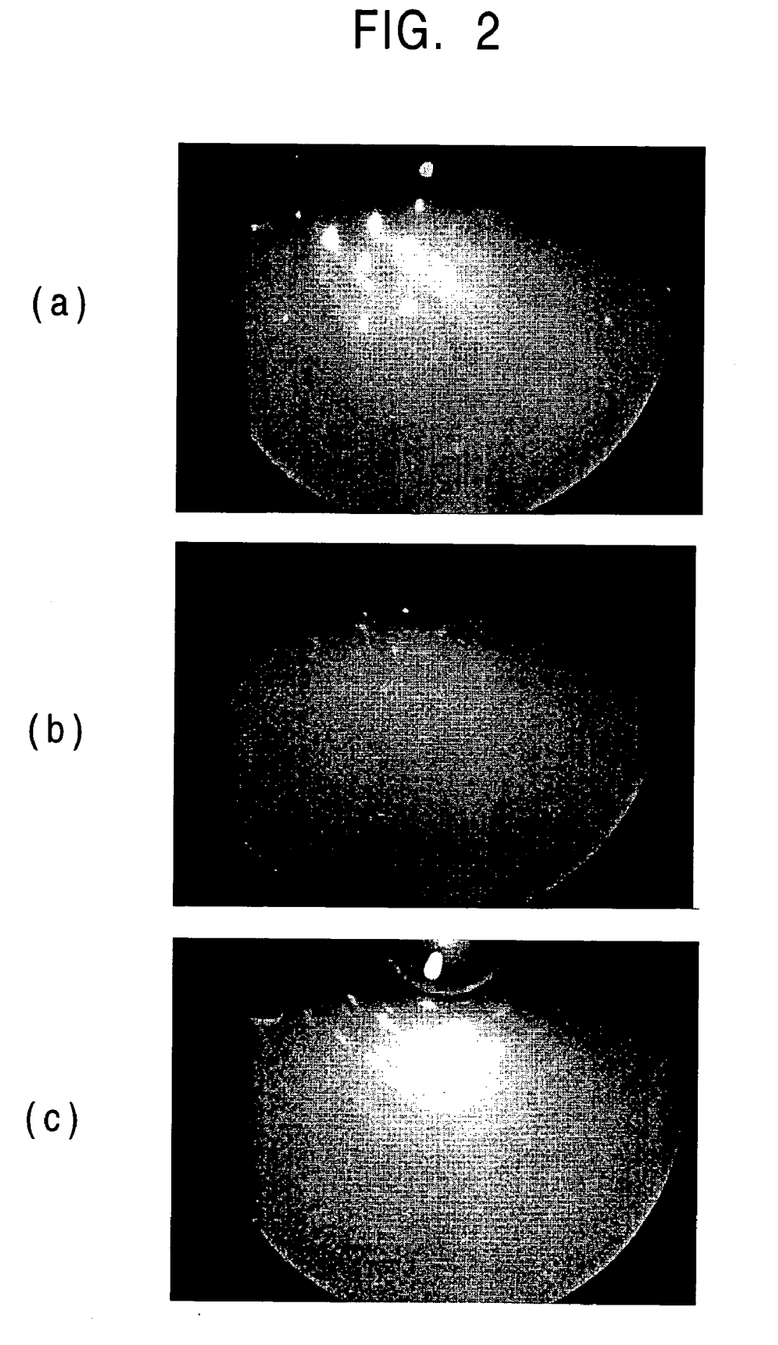
FIG. 2 is representations of electron diffraction patterns of a (112) plane of $CdGeP_2$ in a $CdMnGeP_2$ preparation process according to an example of the present invention.

FIG. 2 is a representation of an high-energy electron diffraction (RHEED) pattern of a (112) plane of $CdGeP_2$ in the preparation process according to the example of the present invention. The incidence direction of the electron beam is [111]$CdGeP_2$.

FIG. 2(a) shows a surface (390° C.) of the $CdGeP_2$ before Mn vapor deposition and indicates that a clean plane of the $CdGeP_2$ appears on the surface. FIG. 2(b) shows the surface (390° C.) after Mn vapor deposition and indicates that the pattern is changed to a halo pattern showing an amorphous state. It is shown that the vapor-deposited Mn is accumulated on the surface.

FIG. 2(c) shows a pattern (C[111], 30 sec, 15 min) after heat treatment and suggests that spots appear again in the same position. It is shown that a $CdGeP_2$ crystal structure is maintained even after the deposited Mn is diffused into the $CdGeP_2$.

Figure 3:
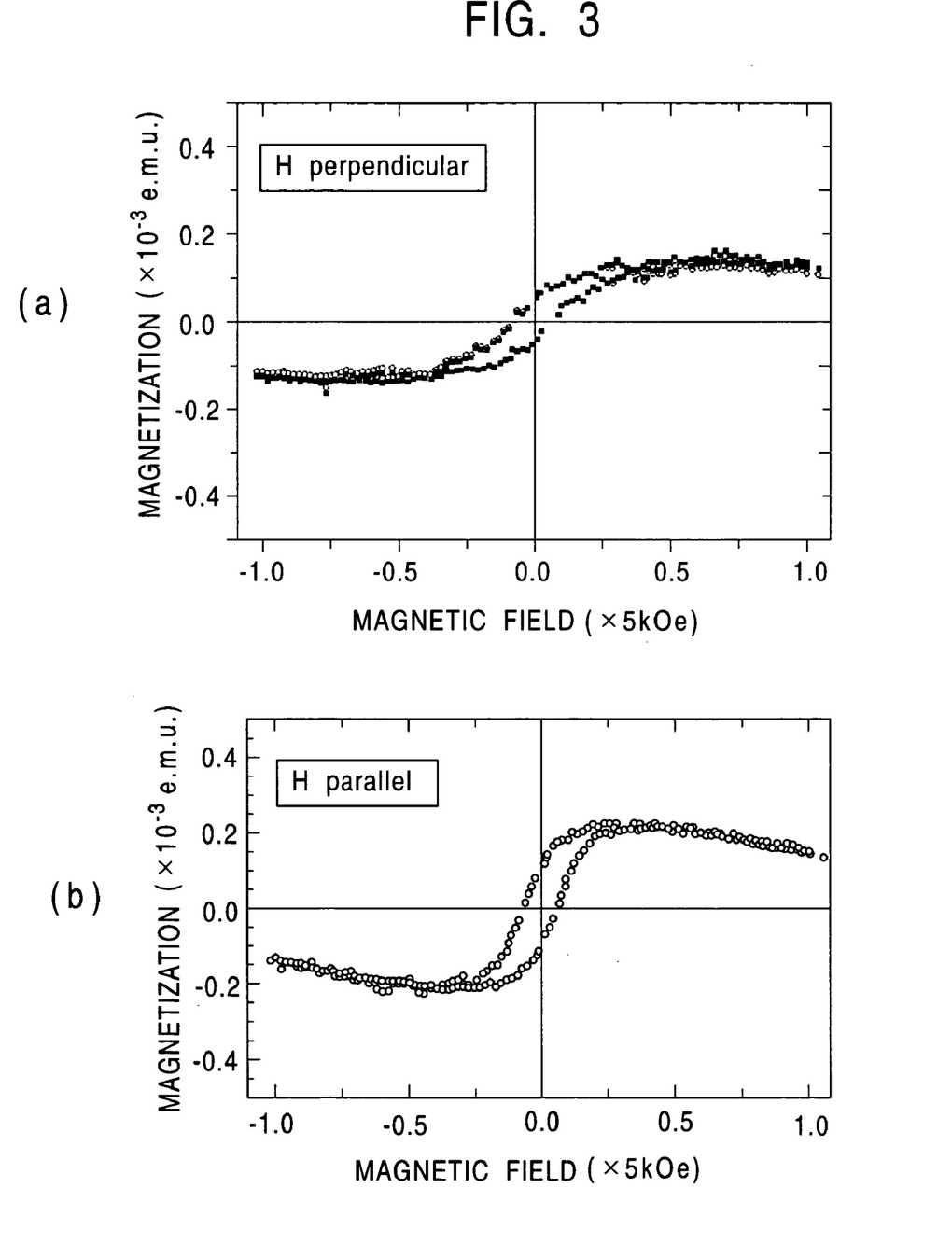
FIG. 3 is a graph showing an M-H loop of $CdMnGeP_2$ at room temperature, according to an example of the present invention.

FIG. 3 is a graph showing a M-H loop of the $CdMnGeP_2$ at room temperature according to the example of the present invention. The horizontal axis represents the magnetic field H (×5 kOe) and the vertical axis represents the magnetization (×$10^{-3}$ e.m.u.) FIG. 3(a) shows an M-H loop when a magnetic field is applied perpendicular to the surface, and FIG. 3(b) shows an M-H loop when a magnetic field is applied parallel to the surface. These drawings indicate that the $CdMnGeP_2$ has magnetization characteristic at room temperature. The drawings also indicate that magnetization is rather easy when a magnetic field is applied to the surface of the sample (when a magnetic field is applied parallel to the surface).

Figure 4:
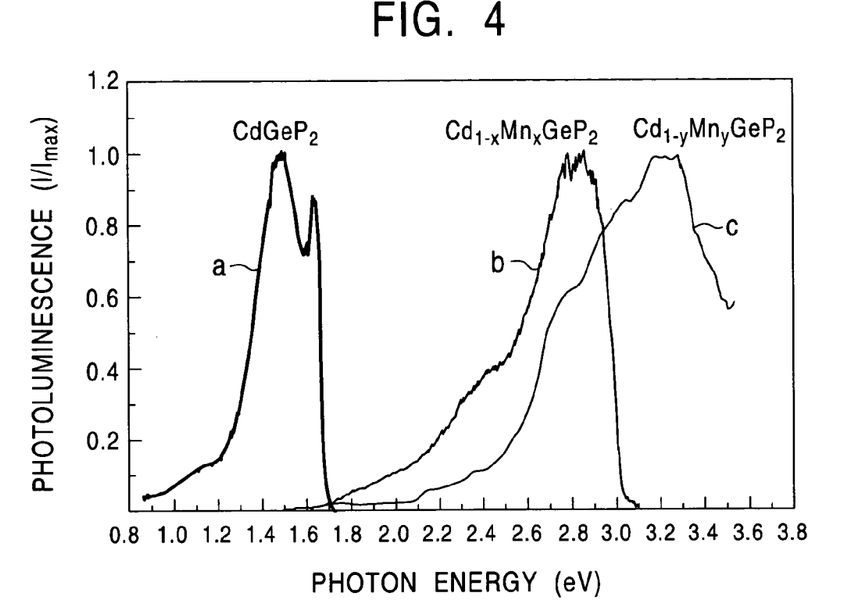
FIG. 4 is a graph showing photoluminescence spectrums of $CdMnGeP_2$ according to an example of the present invention.

FIG. 4 is a graph showing photoluminescence spectrums of $GdMnGeP_2$ (initially $CdGeP_2$) of the example of the present invention. The horizontal axis represents the photon energy (eV), and the vertical axis represents the photoluminescence ($1/1_{max}$). The $CdMnGeP_2$ is prepared by depositing $CdGeP_2$ and Mn at a thickness of 200 to 300 Å.

It is shown that the band gap is about 1.6 eV before adding Mn (spectrum a), and that the peaks of the spectrums after depositing Mn at 200 to 300 Å are shifted to the high energy side and the band gaps become larger (spectrums b and c). The sample in which Mn is deposited at 300 Å is more greatly shifted (spectrum c).

Figure 5:
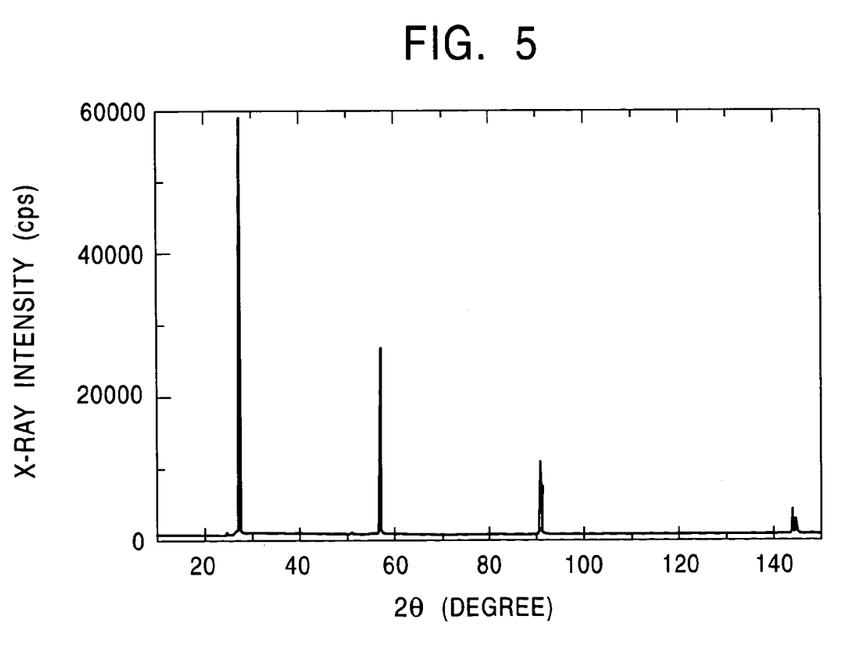
FIG. 5 is a graph showing an X-ray diffraction pattern of $CdMnGeP_2$ according to an example of the present invention.

FIG. 5 is a graph showing an X-ray diffraction pattern of $CdMnGeP_2$ of the example of the present invention. The horizontal axis represents 2θ (degree) and the vertical axis represents the X-ray intensity (cps).

Referring to the graph, it seems that substantially the same diffraction pattern as that of $CdGeP_2$ was obtained. This means that the crystal structure and lattice constant of the $CdMnGeP_2$ are substantially the same as those of $CdGeP_2$.

Another example of the present invention will now be described.

The following describes a method for preparing a magnetic semiconductor material comprising $ZnGeP_2$, according to the present invention.

Mn is vapor-deposited and diffused at a thickness of 300 Å onto a $ZnGeP_2$ single crystal while the $ZnGeP_2$ single crystal is maintained at a temperature of about 400° C. in a molecular beam epitaxy apparatus. In this instance, heat treatment is not performed.

In other words, a magnetic semiconductor material comprising $ZnGeP_2$, having magnetization properties at room temperature is prepared using a $ZnGeP_2$ single crystal as a starting material.

Figure 6:
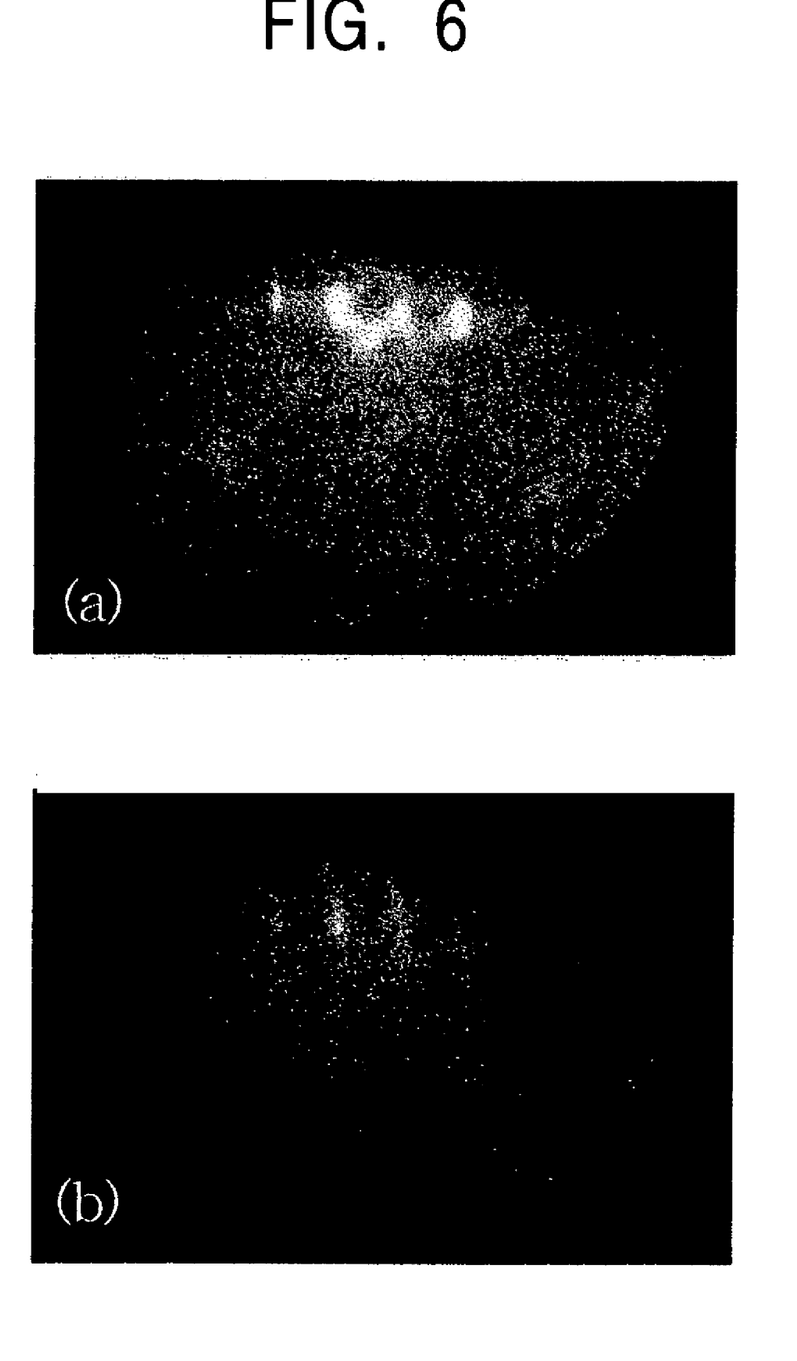
FIG. 6 is representations of electron diffraction patterns of $ZnGeP_2$ in a $ZnMnGeP_2$ preparation process according to an example of the present invention.

FIG. 6 is representations of high-energy electron diffraction (RHEED) patterns of $ZnGeP_2$ according to the example of the present invention. FIG. 6(a) shows the surface of a $ZnGeP_2$ single crystal before Mn is vapor-deposited, and FIG. 6(b) shows the surface after Mn has been deposited.

The sample temperature is 400° C. at this point. It is shown that the surface is flat and has good crystallinity before vapor deposition. Once Mn vapor deposition is started, the surface is gradually changed to a streak pattern. This indicates that the crystal structure is maintained during vapor deposition. It is considered from these results that Mn atoms are diffused into the $ZnGeP_2$ crystal as soon as they are deposited.

Figure 7:
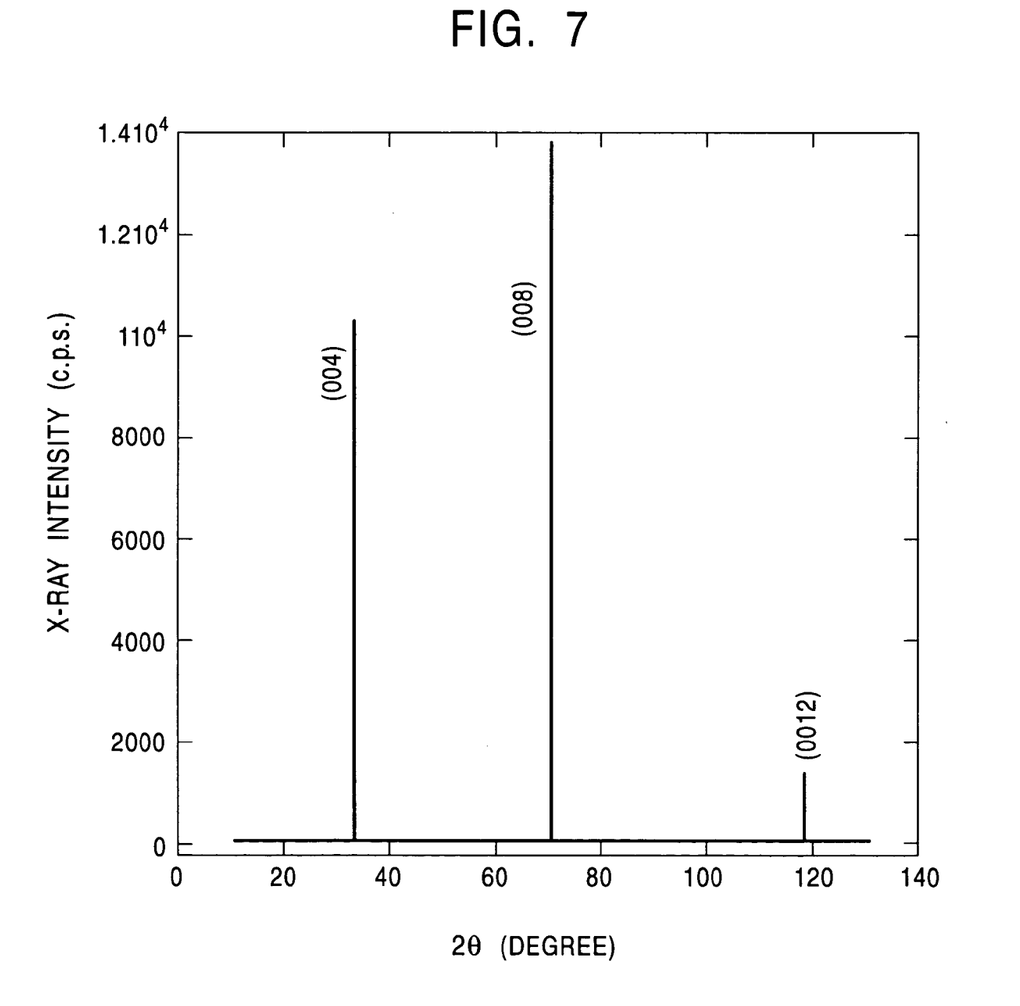
FIG. 7 is a graph showing an X-ray diffraction pattern of $ZnGeP_2$: Mn in which Mn is diffused.

FIG. 7 is a graph showing an X-ray diffraction pattern of $ZdGeP_2$: Mn in which Mn is diffused. The horizontal axis represents 2θ (degree) and the vertical axis represents the X-ray intensity (cps).

This X-ray diffraction pattern also shows only diffraction peaks from $ZnGeP_2$ having good crystallinity, and indicates that the crystal structure and lattice constant of the $ZnnGeP_2$ is substantially the same as those of $ZnGeP_2$.

Figure 8:
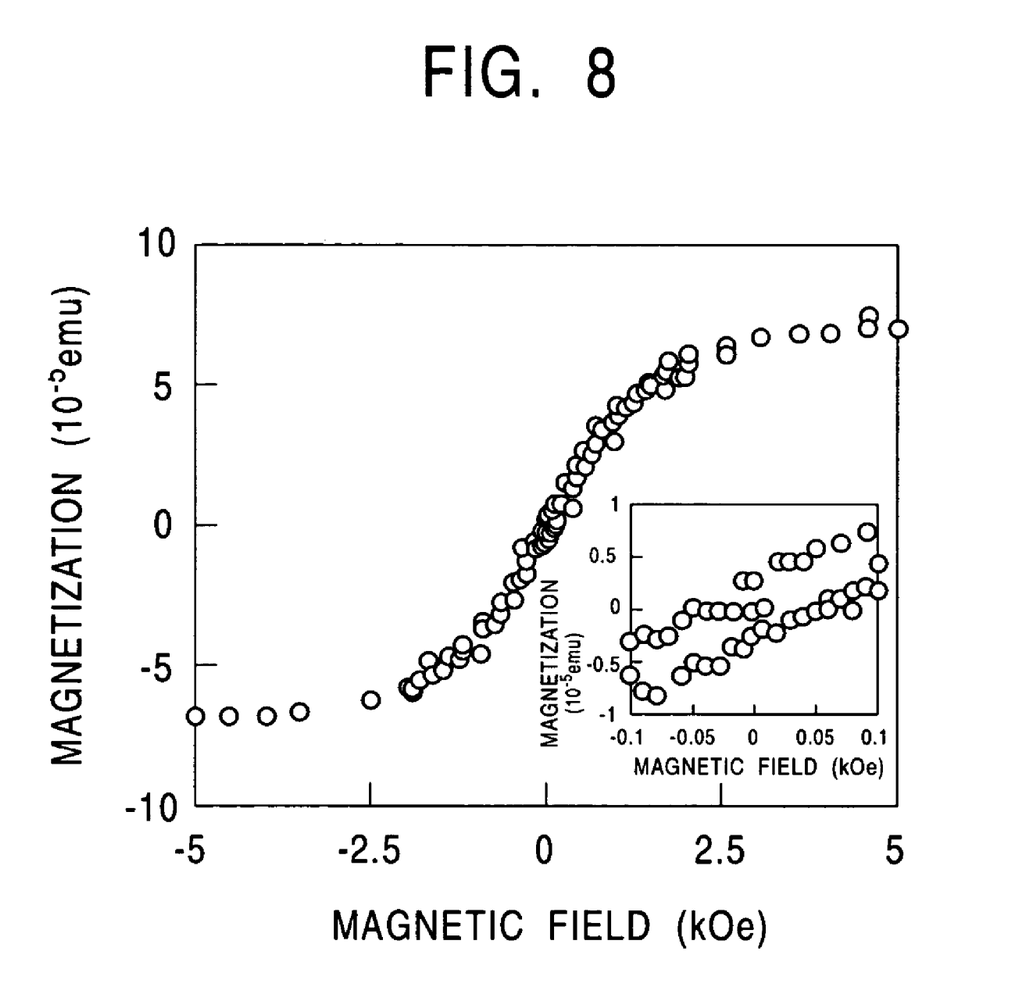
FIG. 8 is a graph showing a magnetization curve (M-H loop) at 350 K of $ZnGeP_2$: Mn in which Mn is diffused.

FIG. 8 is a graph showing a magnetization curve (M-H loop) at 350 K of the $ZnGeP_2$: Mn in which Mn is diffused. The horizontal axis represents the magnetic field H (kOe) and the vertical axis represents the magnetization ($\times 10^{-5}$ e.m.u.)

This drawing shows that magnetization properties is exhibited even at room temperature or more.

The present invention is not limited to the above-described examples, and various modifications may be made according to the spirit of the invention, without departing from the scope of the invention.

As described above, the present invention offers the following advantages:

A magnetic semiconductor material having ferromagnetization properties at room temperature can be obtained.

According to the measurement of the M-H loop of the magnetic semiconductor material, it has shown that the magnetic semiconductor material has magnetization properties at room temperature. The magnetic semiconductor material has a band gap larger than that of CdMnTe, and it is, consequently, expected to be used for a magneto-optical element.

According to a measurement of magneto-optical Kerr spectrum, an approximate Faraday rotation angle of $-5.7 \times 10^4$ deg/cm was estimated at a wavelength of 709 nm. The Faraday rotation angle of paramagnetic CdMnTe generally used for optical isolators is proportional to the magnetic field and is $4 \times 10^3$ deg/cm at a magnetic field of 5 kOe. On the other hand, the ferromagnetic $CdMnGeP_2$ of the present invention has a Faraday rotation angle of 10 times or more that of CdMnTe at a magnetic field as small as 1.5 kOe which is needed to saturate the magnetization. Accordingly, there is a possibility of achieving a magneto-optical element exhibiting more excellent performance than that of known elements. For example, since optical isolators require a magnetic field of only about 1.5 kOe, which is needed to saturate the magnetization, a small permanent magnet suffices. Since, in this instance, the Faraday rotation angle per unit length is large, the thickness of the magnetic semiconductor material may be one tenth or less that of the known material. Thus, a thin isolator can be manufactured.

The $ZnMnGeP_2$ of the present invention can also offer the same advantages as above.

INDUSTRIAL APPLICABILITY

The magnetic semiconductor material of the present invention has magnetization properties at room temperature and a large band gap, and is thus suitably used for magneto-optical elements.

The invention claimed is:

1. A magnetic semiconductor material comprising:
   a Group II-IV-$V_2$ compound, having a chalcopyrite structure, whose constituent elements are partially substituted by a transition element, the magnetic semiconductor material thereby having magnetization properties at room temperature.

2. A magnetic semiconductor material according to claim 1, wherein the Group II-IV-$V_2$ compound is $CdGeP_2$, and the transition element is Mn.

3. A magnetic semiconductor material according to claim 1, wherein the Group II-IV-$V_2$ compound is $ZnGeP_2$, and the transition element is Mn.

4. A method for preparing a magnetic semiconductor material, comprising:
   (a) a vapor-deposition step of vapor-depositing Mn at a thickness of 200 to 300 Å onto a $CdGeP_2$ single crystal while the $CdGeP_2$ single crystal is maintained at a temperature of about 390° C. in a molecular beam epitaxy apparatus; and
   (b) a heating step of heating the Mn-deposited $CdGeP_2$ single crystal at a temperature of about 510° C. for 1 hour to obtain a magnetic semiconductor comprising $CdMnGeP_2$ and having magnetization properties at room temperature.

5. A method for preparing a magnetic semiconductor material according to claim 4, wherein the degree of vacuum in the vapor-deposition step and the heating step is on the order of $10^{-8}$ Torr or less.

6. A method for preparing a magnetic semiconductor material, comprising:
   (a) a vapor deposition step of vapor-depositing and diffusing Mn at a thickness of about 300 Å onto a $ZnGeP_2$ single crystal while the $ZnGeP_2$ single crystal is maintained at a temperature of about 400° C. in a molecular beam epitaxy apparatus, (whereby a magnetic semiconductor comprising $ZnGeP_2$ and having magnetization properties at room temperature or more is obtained without heating after the vapor deposition step.

* * * * *